United States Patent
Zampardi, Jr. et al.

(10) Patent No.: US 9,859,173 B2
(45) Date of Patent: Jan. 2, 2018

(54) METHODOLOGIES RELATED TO STRUCTURES HAVING HBT AND FET

(71) Applicant: Skyworks Solutions, Inc., Woburn, MA (US)

(72) Inventors: Peter J. Zampardi, Jr., Newbury Park, CA (US); Hsiang-Chih Sun, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/394,137

(22) Filed: Dec. 29, 2016

(65) Prior Publication Data

US 2017/0207125 A1  Jul. 20, 2017

Related U.S. Application Data

(63) Continuation of application No. 14/789,583, filed on Jul. 1, 2015, now Pat. No. 9,559,096, which is a
(Continued)

(51) Int. Cl.
*H01L 29/66* (2006.01)
*H01L 21/8249* (2006.01)
(Continued)

(52) U.S. Cl.
CPC ...... *H01L 21/8249* (2013.01); *H01L 21/3081* (2013.01); *H01L 27/0623* (2013.01);
(Continued)

(58) Field of Classification Search
CPC .................................................. H01L 21/8249
See application file for complete search history.

(56) References Cited

U.S. PATENT DOCUMENTS

| 5,445,976 A | 8/1995 | Henderson et al. |
| 6,906,359 B2 | 6/2005 | Zampardi et al. |

(Continued)

FOREIGN PATENT DOCUMENTS

| KR | 10-2006-0064688 A | 6/2006 |
| TW | 200849556 A | 12/2008 |

(Continued)

OTHER PUBLICATIONS

Cheng et al. Solid-State Electronics 43 (1999), 297-304 Table 1—The different InGaP/GaAs HBT's structures used in the theoretical calculation, date listed is 1999, in 8 pages.
(Continued)

*Primary Examiner* — Marc Armand
*Assistant Examiner* — Sarah Salerno
(74) *Attorney, Agent, or Firm* — Knobbe, Martens, Olson & Bear, LLP

(57) ABSTRACT

A semiconductor structure includes a heterojunction bipolar transistor (HBT) including a collector layer located over a substrate, the collector layer including a semiconductor material, and a field effect transistor (FET) located over the substrate, the FET having a channel formed in the semiconductor material that forms the collector layer of the HBT. In some implementations, a second FET can be provided so as to be located over the substrate and configured to include a channel formed in a semiconductor material that forms an emitter of the HBT. One or more of the foregoing features can be implemented in devices such as a die, a packaged module, and a wireless device.

20 Claims, 6 Drawing Sheets

Related U.S. Application Data continuation of application No. 13/288,427, filed on Nov. 3, 2011, now Pat. No. 9,105,488, which is a continuation-in-part of application No. 12/939,474, filed on Nov. 4, 2010, now abandoned.

(51) Int. Cl.
    *H01L 27/06*     (2006.01)
    *H01L 29/737*     (2006.01)
    *H01L 21/308*     (2006.01)
    *H01L 29/08*     (2006.01)
    *H01L 29/205*     (2006.01)
    *H03F 3/213*     (2006.01)
    *H03F 3/195*     (2006.01)

(52) U.S. Cl.
    CPC ........ *H01L 29/0817* (2013.01); *H01L 29/205* (2013.01); *H01L 29/66318* (2013.01); *H01L 29/66446* (2013.01); *H01L 29/737* (2013.01); *H03F 3/195* (2013.01); *H03F 3/213* (2013.01); *H03F 2200/451* (2013.01)

(56) References Cited

U.S. PATENT DOCUMENTS

| | | |
|---|---|---|
| 7,202,736 B1 | 4/2007 | Dow et al. |
| 7,755,107 B2 | 7/2010 | Zampardi et al. |
| 7,928,804 B2 | 4/2011 | Yamamoto et al. |
| 7,989,845 B2 | 8/2011 | Murayama et al. |
| 8,643,118 B2 | 2/2014 | Zampardi et al. |
| 9,105,488 B2 | 8/2015 | Zampardi et al. |
| 9,559,096 B2 | 1/2017 | Zampardi et al. |
| 2003/0116782 A1 | 6/2003 | Mizutani |
| 2005/0139921 A1 | 6/2005 | Kang et al. |
| 2006/0249752 A1 | 11/2006 | Asano |
| 2008/0296624 A1 | 12/2008 | Murayama et al. |
| 2009/0289279 A1 | 11/2009 | Khare |
| 2010/0001319 A1 | 1/2010 | Pelouard et al. |
| 2010/0072517 A1 | 3/2010 | Zampardi et al. |
| 2012/0112243 A1 | 5/2012 | Zampardi et al. |

FOREIGN PATENT DOCUMENTS

| | | |
|---|---|---|
| TW | 201232715 | 8/2012 |
| WO | WO 2009/040509 A1 | 4/2009 |
| WO | WO 2012/061632 A3 | 5/2012 |

OTHER PUBLICATIONS

International Search Report and Written Opinion dated Jun. 29, 2012 in connection with related PCT Application No. PCT/US2011/059208.

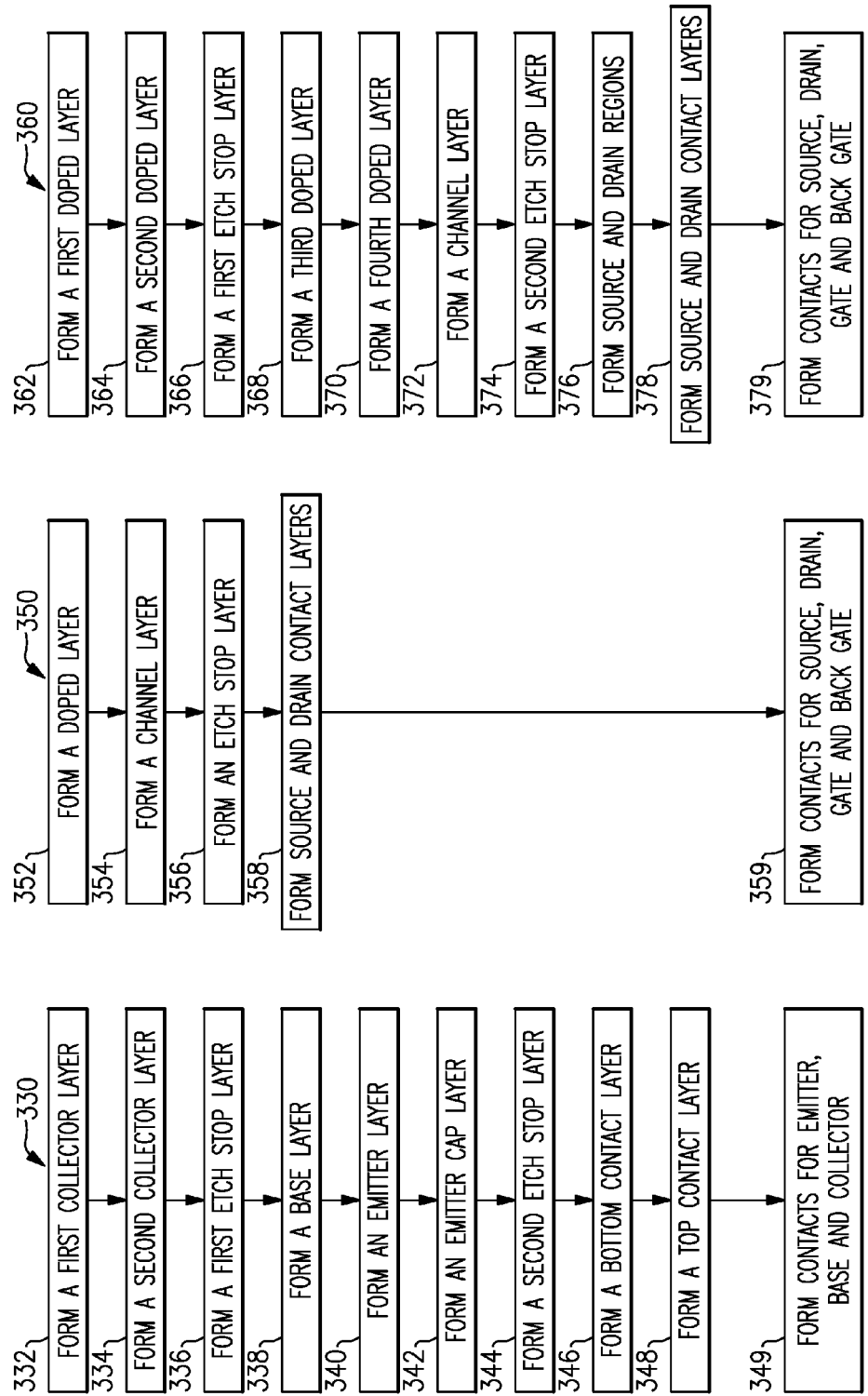

METHODOLOGIES RELATED TO STRUCTURES HAVING HBT AND FET

CROSS-REFERENCE TO RELATED APPLICATIONS

Any and all applications for which a foreign or domestic priority claim is identified in the Application Data Sheet as filed with the present application are hereby incorporated by reference under 37 CFR 1.57.

BACKGROUND

In some semiconductor material systems it is possible to combine different device technologies on a single semiconductor die to form hybrid structures. For example, in certain material systems, it is possible to integrate a heterojunction bipolar transistor (HBT) with a field effect transistors (FET) on a single substrate, to fabricate what is referred to as a BiFET. Devices, such as RF power amplifiers, can be fabricated using BiFET technology to have increased design flexibility. As a result, a BiFET power amplifier including an HBT and a FET can be advantageously designed to operate at a lower reference voltage than a bipolar transistor power amplifier. Of particular interest to device manufacturers are high power BiFET amplifiers, which can be formed by integrating a FET into a gallium arsenide (GaAs) HBT process. However, previous attempts to integrate a FET into a GaAs HBT process have resulted only in an n-type FET device.

Therefore, it would be desirable to have a BiFET device structure that includes a p-type FET device, and that may include complementary n-type and p-type FET devices.

SUMMARY

Embodiments of a semiconductor structure include a heterojunction bipolar transistor (HBT) including a collector layer located over a substrate, the collector layer comprising a semiconductor material, and a field effect transistor (FET) located over the substrate, the FET comprising a channel formed in the semiconductor material that forms the collector layer of the HBT.

In some embodiments, the semiconductor material that forms the collector layer of the HBT and the channel of the FET can include p-type gallium arsenide. In some embodiments, the semiconductor structure can further include an etch stop layer segment located over the collector layer of the HBT and the channel of the FET. In some embodiments, such an etch stop layer can include indium gallium arsenide (InGaAs) or indium gallium phosphide (InGaP), and can have a thickness range between 10 nanometers (nm) and 15 nm. Other thickness ranges can also be implemented. In some embodiments, such an etch stop layer can include any material with etch selectivity to, for example, the channel layer of the FET. Such a material can be implemented in an appropriate thickness or within an appropriate range of thicknesses so as to achieve similar results as the foregoing example materials InGaAs or InGaP.

In accordance with some embodiments, the present disclosure relates to a semiconductor structure having a heterojunction bipolar transistor (HBT) that includes a collector layer located over a substrate and an emitter layer located over the substrate. The collector layer includes a first semiconductor material of a first conductivity type (P), and the emitter layer includes a second semiconductor material of a second conductivity type (N). The semiconductor structure further includes a first field effect transistor (FET) located over the substrate. The first FET includes a channel formed in the first semiconductor material that forms the collector layer of the HBT. The semiconductor structure further includes a second field effect transistor (FET) located over the substrate. The second FET includes a channel formed in the second semiconductor material that forms the emitter layer of the HBT.

In some embodiments, the first semiconductor material that forms the collector layer of the HBT and the channel of the first FET can include p-type gallium arsenide, and the second semiconductor material that forms the emitter layer of the HBT and the channel of the second FET can include n-type gallium arsenide. In some embodiments, semiconductor structure can further include a first etch stop layer segment located over the collector layer of the HBT and the channel of the first FET, and a second etch stop layer segment located over the emitter layer of the HBT and the channel of the second FET. The first etch stop layer segment and the second etch stop layer segment can include indium gallium arsenide (InGaAs) or indium gallium phosphide (InGaP), and can have a thickness range between 10 nanometers (nm) and 15 nm. Other thickness ranges can also be implemented. In some embodiments, such etch stop layers can include any material with etch selectivity to, for example, the channel layers of the first and second FETs. Such a material can be implemented in an appropriate thickness or within an appropriate range of thicknesses so as to achieve similar results as the foregoing example materials InGaAs or InGaP.

In a number of implementations, the present disclosure relates to a method that includes forming a heterojunction bipolar transistor (HBT) including a collector layer located over a substrate and an emitter layer located over the substrate. The collector layer includes a first semiconductor material of a first conductivity type (P), and the emitter layer includes a second semiconductor material of a second conductivity type (N). The method further includes forming a first field effect transistor (FET) over the substrate. The first FET includes a channel formed in the first semiconductor material that forms the collector layer of the HBT. The method further includes forming a second field effect transistor (FET) over the substrate. The second FET includes a channel formed in the second semiconductor material that forms the emitter layer of the HBT.

In some implementations, the first semiconductor material that forms the collector layer of the HBT and the channel of the first FET can include p-type gallium arsenide, and the second semiconductor material that forms the emitter layer of the HBT and the channel of the second FET can include n-type gallium arsenide. In some implementations, the method can further include forming a first etch stop layer segment over the collector layer of the HBT and the channel of the first FET, and forming a second etch stop layer segment over the emitter layer of the HBT and the channel of the second FET. The first etch stop layer segment and the second etch stop layer segment can include indium gallium arsenide (InGaAs) or indium gallium phosphide (InGaP), and can have a thickness range between 10 nanometers (nm) and 15 nm.

According to some implementations, the present disclosure relates to a method that includes forming a heterojunction bipolar transistor (HBT) including a collector layer located over a substrate. The collector layer includes a semiconductor material. The method further includes forming a field effect transistor (FET) located over the substrate.

The FET includes a channel formed in the semiconductor material that forms the collector layer of the HBT.

In some implementations, the semiconductor material that forms the collector layer of the HBT and the channel of the FET can include p-type gallium arsenide. In some implementations, the method can further include forming an etch stop layer segment located over the collector layer of the HBT and the channel of the FET. The etch stop layer can include indium gallium arsenide (InGaAs) or indium gallium phosphide (InGaP), and can have a thickness range between 10 nanometers (nm) and 15 nm.

According to some embodiments, the present disclosure relates to a die having an integrated circuit (IC). The die includes a circuit configured to process radiofrequency (RF) signal. The die further includes an assembly of a heterojunction bipolar transistor (HBT) and a field effect transistor (FET) configured to facilitate operation of the circuit. The HBT includes a collector layer including a semiconductor material located over a substrate. The FET includes a channel located over the substrate and formed in the semiconductor material that forms the collector layer of the HBT.

In some embodiments, the circuit configured to process RF signal can include a power amplifier circuit, a controller circuit for the power amplifier circuit, or a controller for a switching circuit. In some embodiments, the assembly can further include a second FET having a channel located over the substrate and formed in same semiconductor material as an emitter of the HBT. The first FET can include a pFET, and the second FET can include an nFET. In some embodiments, the substrate can include gallium arsenide (GaAs).

In a number of embodiments, the present disclosure relates to a packaged module for a radiofrequency (RF) device. The module includes a packaging substrate and an integrated circuit (IC) formed on a die and mounted on the packaging substrate. The IC includes an assembly of a heterojunction bipolar transistor (HBT) and a field effect transistor (FET) configured to facilitate operation of the IC. The HBT includes a collector layer including a semiconductor material located over a die substrate. The FET includes a channel located over the die substrate and formed in the semiconductor material that forms the collector layer of the HBT. The module further includes one or more connections configured to facilitate transfer of power to the IC and RF signals to and from the IC.

In some embodiments, the assembly can further include a second FET having a channel located over the die substrate and formed in same semiconductor material as an emitter of the HBT. The first FET can include a pFET and the second FET can include an nFET.

In accordance with some embodiments, the present disclosure relates to a wireless device having an antenna and a radiofrequency integrated circuit (RFIC) configured to process RF signals received from the antenna and for transmission through the antenna. The wireless device further includes a power amplifier (PA) circuit configured to amplify the RF signals. The PA circuit includes an assembly of a heterojunction bipolar transistor (HBT) and a field effect transistor (FET). The HBT includes a collector layer including a semiconductor material located over a substrate. The FET includes a channel located over the substrate and formed in the semiconductor material that forms the collector layer of the HBT.

In some embodiments, the PA can be configured to operate as a high power BiFET amplifier capable of operating at a lower reference voltage than that of a bipolar transistor PA. In some embodiments, the substrate can include gallium arsenide (GaAs).

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

FIG. 5 shows a process that can be implemented to fabricate the example HBTs of FIGS. 1 and 2.

FIG. 6 shows a process that can be implemented to fabricate the example FET of FIG. 1 and the first FET of FIG. 2.

FIG. 7 shows a process that can be implemented to fabricate the example second FET of FIG. 2.

DETAILED DESCRIPTION

Although described with particular reference to a device fabricated in the gallium arsenide (GaAs) material system, the structures described herein can be fabricated using other III-V semiconductor materials, such as indium phosphide (InP) and gallium nitride (GaN). Further, any of a variety of semiconductor growth, formation and processing technologies can be used to form the layers and fabricate the structure or structures described herein. For example, the semiconductor layers can be formed using molecular beam epitaxy (MBE), metal organic chemical vapor deposition (MOCVD), which is also sometimes referred to as organic metallic vapor phase epitaxy (OMVPE), or any other technique. Moreover, the thicknesses of the various semiconductor layers described below are approximate, and may range to thinner or thicker than that described. Similarly, the doping levels of the doped semiconductor layers described below are relative.

The present invention is directed to a semiconductor structure that includes a bipolar device, such as a heterojunction bipolar transistor (HBT), and a p-type field effect transistor (pFET) integrated on a common substrate, referred to generally as a BiFET, and formed in a GaAs material system. Embodiments also include a complementary BiFET (BiCFET) including a p-type FET (pFET) and an n-type FET (nFET) integrated with an HBT in a GaAs material system. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. Certain details and features have been left out of the drawings, which will be apparent to a person of ordinary skill in the art. Although structure 100 illustrates an exemplary BiFET comprising an NPN HBT and a pFET, which are situated over a substrate in a semiconductor die, the present invention may also apply to a BiFET comprising a PNP HBT and an NFET; an NPN HBT and both an nFET and a pFET; and a PNP HBT and both an nFET and a pFET.

Figure 1:
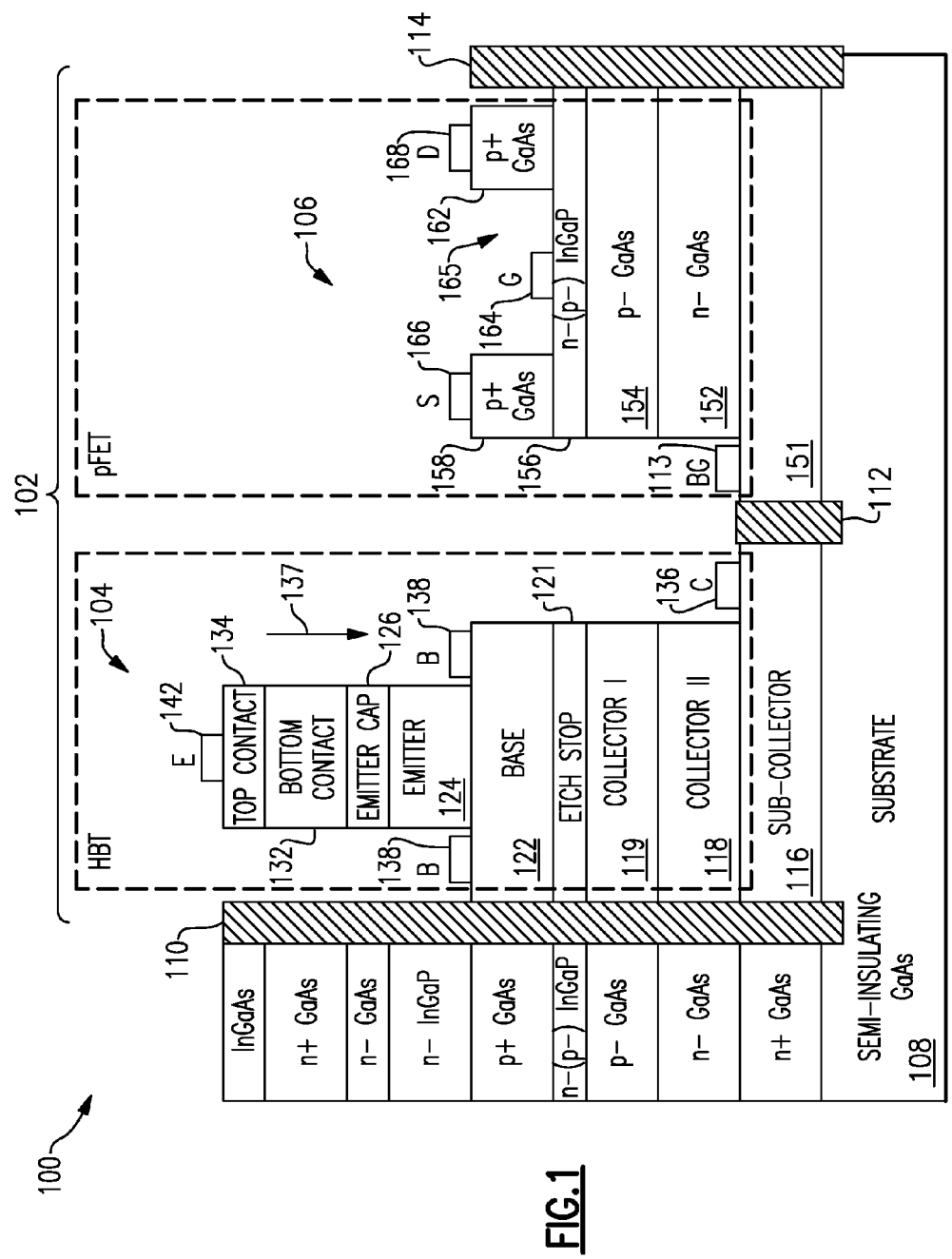
FIG. 1 is a schematic diagram illustrating a cross-sectional view of an exemplary structure including an exemplary BiFET.

FIG. 1 is a schematic diagram illustrating a cross-sectional view of an exemplary structure including an exemplary BiFET in accordance with one embodiment of the present invention. Certain details and features have been left out of FIG. 1, which are apparent to a person of ordinary skill in the art. The structure 100 includes BiFET 102, isolation regions 110, 112, and 114, and substrate 108, which can be a semi-insulating GaAs substrate. The BiFET 102 includes an HBT 104, which is located over substrate 108 between isolation regions 110 and 112, and pFET 106, which is located over substrate 108 between isolation regions 112 and 114. Isolation regions 110, 112, and 114 provide electrical isolation from other devices on substrate 108 and can be formed in a manner known in the art.

The HBT 104 includes sub-collector layer 116, a first collector layer segment 118, a second collector layer segment 119, an optional etch-stop layer segment 121, a base layer segment 122, an emitter layer segment 124, an emitter cap layer segment 126, a bottom contact layer segment 132, a top contact layer segment 134, collector contact 136, base contacts 138, and emitter contact 142.

For the purpose of description herein, an emitter can include one or more parts associated with an emitter stack. In the example HBT configuration 104 of FIG. 1, such an emitter stack can include the emitter layer 124, the emitter cap layer 126, the bottom contact layer 132, and the top contact layer 134. Accordingly, an emitter as described herein can include the emitter layer 124 and/or the emitter cap layer 126.

Also for the purpose of description herein, the example HBT topology is described in the context of GaAs/InGaP. It will be understood, however, that one or more features of the present disclosure can also be applied to other material systems used for HBTs, including, for example, indium phosphide (InP), antimonides, or nitride based materials.

The pFET 106 includes a back gate contact 113, a lightly doped N type GaAs segment 152, a lightly doped P type GaAs segment 154, an optional etch stop layer segment 156, typically comprising lightly doped N type or P type InGaP, source contact layer 158 and drain contact layer 162, typically comprising heavily doped P type GaAs, gate contact 164, source contact 166, and drain contact 168. Alternatively, the optional etch stop layer segment 156 can be undoped. In the present embodiment, the HBT 104 can be an NPN HBT integrated in a complementary arrangement with the pFET 106. In another embodiment, the HBT 104 can be a PNP HBT integrated with an nFET, or can be a PNP HBT or an NPN HBT integrated with the pFET 106 and with an nFET. In the present embodiment, the pFET 106 can be a depletion mode FET or an enhancement mode FET.

The sub-collector layer 116 is situated on substrate 108 and can comprise heavily doped N type GaAs. The sub-collector layer 116 can be formed by using a metal organic chemical vapor deposition (MOCVD) process or other processes. The first collector layer segment 118 and the collector contact 136 are located on the sub-collector layer 116. The first collector layer segment 118 can comprise lightly doped N type GaAs. The second collector layer segment 119 can comprise lightly doped P type GaAs. The first collector layer segment 118 and the second collector layer segment 119 can be formed by using a MOCVD process or other processes. The collector contact 136 can comprise an appropriate metal or combination of metals, which can be deposited and patterned over the sub-collector layer 116.

The optional etch stop layer segment 121 can be located on the second collector layer segment 119 and can comprise lightly doped N type or P type InGaP. Alternatively, the optional etch stop layer segment 121 can be undoped. The etch stop layer segment 121 can be formed by using a MOCVD process or other processes.

The base layer segment 122 is located on the etch stop layer segment 121 and can comprise heavily doped P type GaAs. The base layer segment 122 can be formed by using a MOCVD process or other processes.

The emitter layer segment 124 and base contacts 138 are located on base layer segment 122. The emitter layer segment 124 can comprise lightly doped N type indium gallium phosphide (InGaP) and can be formed on the base layer segment 122 by using a MOCVD process or other processes. The base contacts 138 can comprise an appropriate metal or combination of metals, which can be deposited and patterned over base layer segment 122. The emitter cap layer segment 126 is located on the emitter layer segment 124 and can comprise lightly doped N type GaAs. The emitter cap layer segment 126 can be formed by using a MOCVD process or other processes.

The bottom contact layer segment 132 is located on the emitter cap layer segment 126 and can comprise heavily doped N type GaAs. The bottom contact layer segment 132 can be formed by using an MOCVD process or other processes.

The top contact layer segment 134 is situated on the bottom contact layer segment 132 and can comprise heavily doped N type indium gallium arsenide (InGaAs). The top contact layer segment 134 can be formed by using a MOCVD process or other processes. The emitter contact 142 is located on the top contact layer segment 134 and can comprise an appropriate metal or combination of metals, which can be deposited and patterned over top contact layer segment 134.

During operation of the HBT 104, current flows from the emitter contact 142, through the top contact layer segment 134, bottom contact layer segment 132, emitter cap layer segment 126, emitter layer segment 124, and into the base layer segment 122 and is indicated by arrow 137.

To form the pFET 106 in the collector of the HBT 104, a lightly doped P type GaAs layer segment 154 is located over a lightly doped N type GaAs layer segment 152, which is located over a heavily doped N type GaAs layer segment 151. A back gate contact 113 is formed on the heavily doped N type GaAs layer segment 151 to create a back gate for the pFET 106. The back gate contact 113 can comprise an appropriate metal or combination of metals, which can be deposited and patterned over the heavily doped N type GaAs layer segment 151.

The lightly doped N type GaAs layer segment 152 is substantially similar in composition and formation to the first collector layer segment 118 discussed above. The lightly doped P type GaAs layer segment 154 is substantially similar in composition and formation to the second collector layer segment 119 discussed above.

The lightly doped P type GaAs layer segment 154 forms the channel of the pFET 106. The etch stop layer segment 156 is situated on the lightly doped P type GaAs layer segment 154 and can comprise lightly doped N type or P type InGaP. Alternatively, the etch stop layer segment 156 can be undoped. The etch stop layer segment 156 can be formed on the lightly doped P type GaAs layer segment 154 by using a MOCVD process or other appropriate processes. If implemented, the etch stop layer segment 156 can have a thickness between approximately 10 nanometers (nm) and approximately 15 nm. In one embodiment, the pFET 106 can be an enhancement mode FET and the etch stop layer segment 156 can have a thickness less than 10 nm.

The source contact layer 158 and the drain contact layer 162 are located on the etch stop layer segment 156 and can comprise heavily doped P type GaAs to form source and drain regions, respectively. The source and drain contact layers 158 and 162 can be formed by using a MOCVD process or other processes. A source contact 166 and drain contact 168 are located on the etch stop layer segment 156. Source contact 166 and drain contact 168 can comprise platinum gold ("PtAu") or other appropriate metals and can be formed in a manner known in the art. A gate contact 164 is located on the etch stop layer segment 156 in gap 165, which is formed between source and drain contact layers 158 and 162, and can comprise an appropriate metal or combination of metals. The gap 165 can be formed by utilizing an appropriate etch chemistry to selectively etch through a layer of InGaAs and a layer of GaAs and stop on etch stop layer segment 156. After the gap 165 has been formed, gate contact 164 can be formed on etch stop layer segment 156 in a manner known in the art. In one embodiment, the FET 106 can be an enhancement mode FET and gate contact 164 can be formed directly on the lightly doped P type GaAs layer segment 154. In that embodiment, an appropriate etch chemistry can be utilized to selectively etch through etch stop layer segment 156 and stop on lightly doped P type GaAs layer segment 154.

Thus, by forming the pFET 106 in the layers that comprise the collector of the HBT 104, a pFET can be integrated with an NPN HBT, yielding a complementary BiFET.

Figure 2:
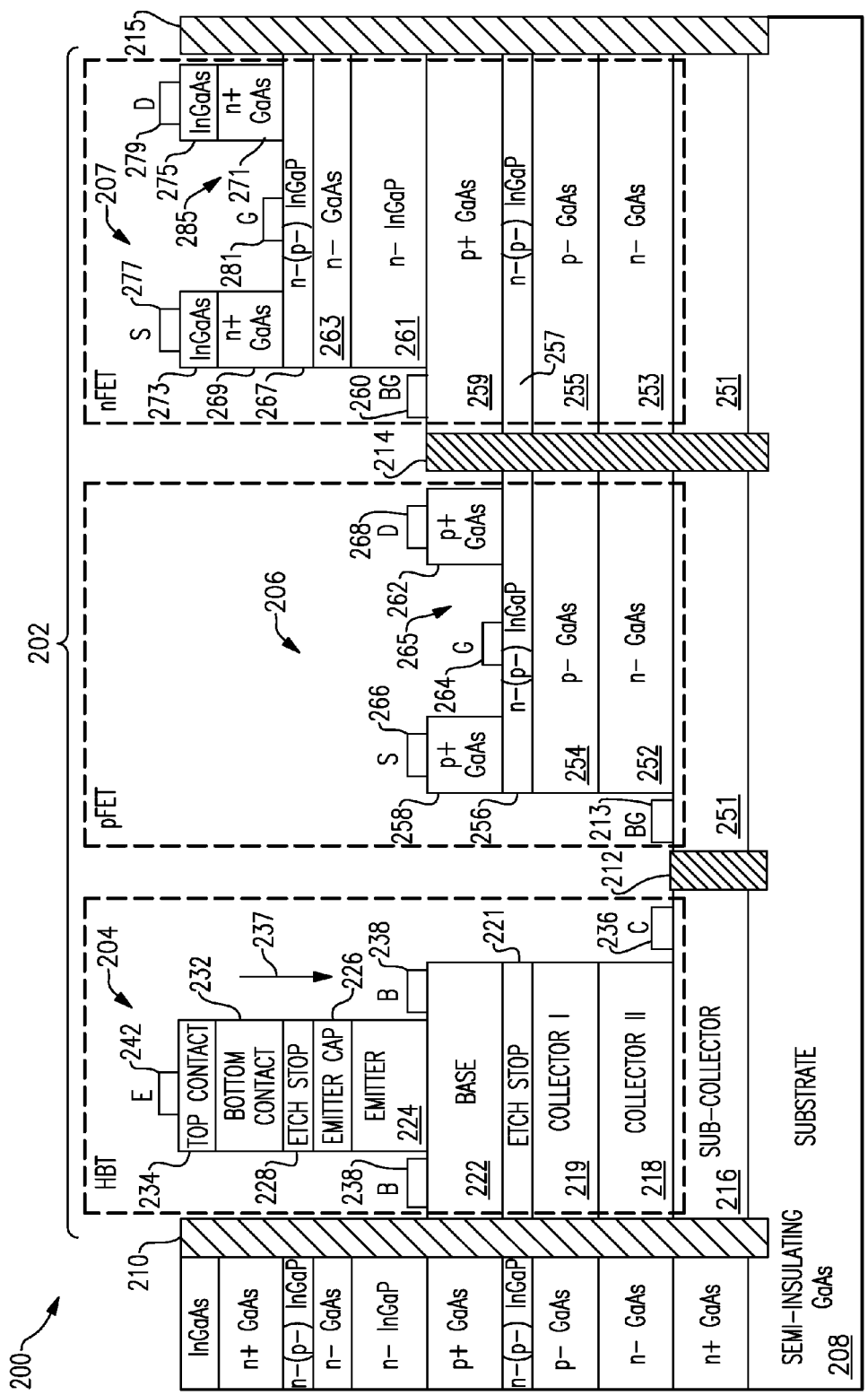
FIG. 2 is a schematic diagram illustrating a cross-sectional view of an alternative embodiment of the structure of FIG. 1.

FIG. 2 is a schematic diagram illustrating a cross-sectional view of an alternative embodiment of the structure of FIG. 1. The structure 200 shown in FIG. 2 includes a BiCFET structure that includes an HBT 204, a pFET 206 and an nFET 207.

Elements and structures in FIG. 2 that are similar to corresponding elements and structures in FIG. 1 will not be described again in detail, but instead, will be referred to using the nomeclature 2XX, where "XX" refers to a similar element in FIG. 1.

The BiCFET 202 includes an HBT 204 located between isolation region 210 and isolation region 212, a pFET 206 located between isolation region 212 and 214, and includes an nFET 207 located between isolation region 214 and isolation region 215.

The HBT 204 includes sub-collector layer 216, a first collector layer segment 218, a second collector layer segment 219, an optional etch-stop layer segment 221, a base layer segment 222, an emitter layer segment 224, an emitter cap layer segment 226, a second optional etch stop layer 228, a bottom contact layer segment 232, a top contact layer segment 234, collector contact 236, base contacts 238, and emitter contact 242.

As description herein, an emitter can include one or more parts associated with an emitter stack. In the example HBT configuration 204 of FIG. 2, such an emitter stack can include the emitter layer 224, the emitter cap layer 226, second etch stop layer 228, the bottom contact layer 232, and the top contact layer 234. Accordingly, an emitter as described herein can include the emitter layer 224 and/or the emitter cap layer 226.

As also described herein, the example HBT topology is described in the context of GaAs/InGaP. It will be understood, however, that one or more features of the present disclosure can also be applied to other material systems used for HBTs, including, for example, indium phosphide (InP), antimonides, or nitride based materials.

The pFET 206 comprises a lightly doped P type GaAs layer segment 254 located over a lightly doped N type GaAs layer segment 252, which is located over a heavily doped N type GaAs layer segment 251. A back gate contact 213 is formed on the heavily doped N type GaAs layer segment 251 to create a back gate for the pFET 206. The back gate contact 213 can comprise an appropriate metal or combination of metals, which can be deposited and patterned over the heavily doped N type GaAs layer segment 251.

The lightly doped P type GaAs layer segment 254 forms the channel of the pFET 206. The etch stop layer segment 256 is situated on the lightly doped P type GaAs layer segment 254 and can comprise lightly doped N type or P type InGaP. Alternatively, the optional etch stop layer segment 256 can be undoped. The etch stop layer segment 256 can be formed on the lightly doped P type GaAs layer segment 254 by using a MOCVD process or other appropriate processes. If implemented, the etch stop layer segment 256 can have a thickness between approximately 10 nanometers (nm) and approximately 15 nm. The source contact layer 258 and the drain contact layer 262 are located on the etch stop layer segment 256 and can comprise heavily doped P type GaAs to form source and drain regions, respectively. A source contact 266 and drain contact 268 are located on the etch stop layer segment 256. A gate contact 264 is located on the etch stop layer segment 256 in gap 285, which is formed between source and drain regions 258 and 262, and can comprise an appropriate metal or combination of metals.

To form the nFET 207 in the layers that comprise the emitter of the HBT 104, a lightly doped P type GaAs layer segment 255 is located over a lightly doped N type GaAs layer segment 253, which is located over the heavily doped N type GaAs layer segment 251. The lightly doped N type GaAs layer segment 253 is substantially similar in composition and formation to the first collector layer segment 118 discussed above. The lightly doped P type GaAs layer segment 255 is substantially similar in composition and formation to the second collector layer segment 119 discussed above.

An etch stop layer segment 257 is located on the lightly doped P type GaAs layer segment 255 and is similar to the etch stop layer segment 256.

A heavily doped P type GaAs layer segment 259 is located on the etch stop layer segment 257 and is substantially similar in composition and formation to base layer segment 122 discussed above. A back gate contact 260 is formed on the heavily doped P type GaAs layer segment 259 to create a back gate for the nFET 207. The back gate contact 260 can comprise an appropriate metal or combination of metals, which can be deposited and patterned over the heavily doped P type GaAs layer segment 259. A lightly doped N type InGaP segment 261 is located on the heavily doped P type GaAs segment 259 and is substantially similar in composition and formation to the emitter layer segment 124 discussed above.

A lightly doped N type GaAs layer segment 263 is located on the lightly doped N type InGaP layer segment 261 and is substantially similar in composition and formation to the emitter cap layer segment 126 discussed above. The lightly doped N type GaAs layer segment 263 forms a channel for the nFET 207. The second optional etch stop layer segment 267 is located on the lightly doped N type GaAs layer segment 263 and can comprise lightly doped N type or P type InGaP. Alternatively, the second optional etch stop layer segment 267 can be undoped. The second optional etch stop layer segment 267 can be formed on the lightly doped N type GaAs layer segment 263 by using a MOCVD process or other appropriate processes. In an embodiment, the second optional etch stop layer segment 267 can have a thickness between approximately 10 nm and approximately 15 nm. In an embodiment, the nFET 207 can be an enhancement mode FET and the etch stop layer segment 267 can have a thickness less than 10 nm.

A source region 269 and drain region 271 are located on the second optional etch stop layer segment 267 and can comprise heavily doped N type GaAs. The source region 269 and the drain region 271 can be formed by using a MOCVD process or other processes. Contact layer segments 273 and 275 are located on source and drain regions 269 and 271, respectively, and can comprise heavily doped N type InGaAs. Contact layer segments 273 and 275 can be formed by using a MOCVD process or other processes.

A source contact 277 and a drain contact 279 are located on top contact layer segments 271 and 273, respectively. A gate contact 281 is located on the second optional etch stop layer segment 267 in gap 285. Gap 285 can be formed by utilizing an appropriate etch chemistry to selectively etch through a layer of InGaAs and a layer of GaAs and stop on second optional etch stop layer segment 267. After gap 285 has been formed, gate contact 281 can be formed on the second optional etch stop layer segment 267 in a manner known in the art. In an embodiment, the nFET 207 can be an enhancement mode FET and gate contact 281 can be formed directly on lightly doped N type GaAs layer segment 263. In that embodiment, an appropriate etch chemistry can be utilized to selectively etch through the second optional etch stop layer segment 267 and stop on lightly doped N type GaAs layer segment 263.

Accordingly, a BiCFET can be fabricated that includes complementary pFET 206 and nFET 207, formed on a GaAs substrate along with either an NPN or a PNP HBT.

In some embodiments as described herein, some or all of the etch stop layers (e.g., 121, 156, 221, 228, 256, 257 and 267) can include indium gallium phosphide (InGaP) or indium gallium arsenide (InGaAs). Such an etch stop layer can have a thickness range between 10 nanometers (nm) and 15 nm. Other thickness ranges can also be implemented. In some embodiments, some or all of the foregoing etch stop layers can include any material with etch selectivity to, for example, a channel of an FET. Such a material can be implemented in an appropriate thickness or within an appropriate range of thicknesses so as to achieve similar results as the foregoing example materials InGaP or InGaAs.

Figure 3:
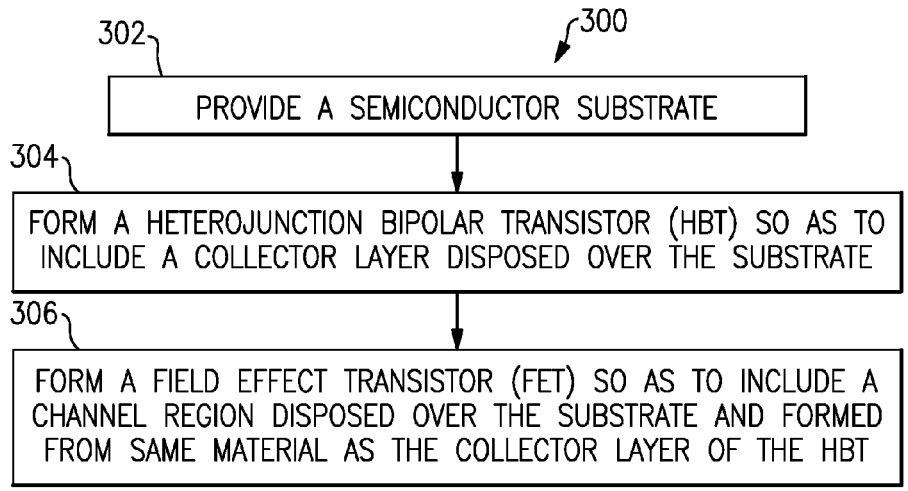
FIG. 3 shows a process that can be implemented to fabricate the example structure of FIG. 1.

FIG. 3 shows a process 300 that can be implemented to fabricate the example BiFET 102 of FIG. 1 or a portion of the example BiCFET 202 of FIG. 2. In block 302, a semiconductor substrate can be provided. In some embodiments, such a semiconductor layer can include one or more layers disclosed herein, including a semi-insulating GaAs layer such as the example layers 108 and 208 of FIGS. 1 and 2. In block 304, a heterojunction bipolar transistor (HBT) can be formed so as to include a collector layer disposed over the substrate. In some embodiments, such a collector layer can include one or more layers disclosed herein, including a p– GaAs layer (119 in FIGS. 1 and 219 in FIG. 2). In block 306, a field effect transistor (FET) can be formed so as to include a channel region disposed over the substrate and formed from the same material as the collector layer of the HBT. In some embodiments, such a channel region can include one or more layers disclosed herein, including the p– GaAs layer (154 in FIGS. 1 and 254 in FIG. 2). In some implementations, other structures associated with the HBT (e.g., base, emitter and contacts) and the FET (e.g., source, drain and contacts) can be formed.

Figure 4:
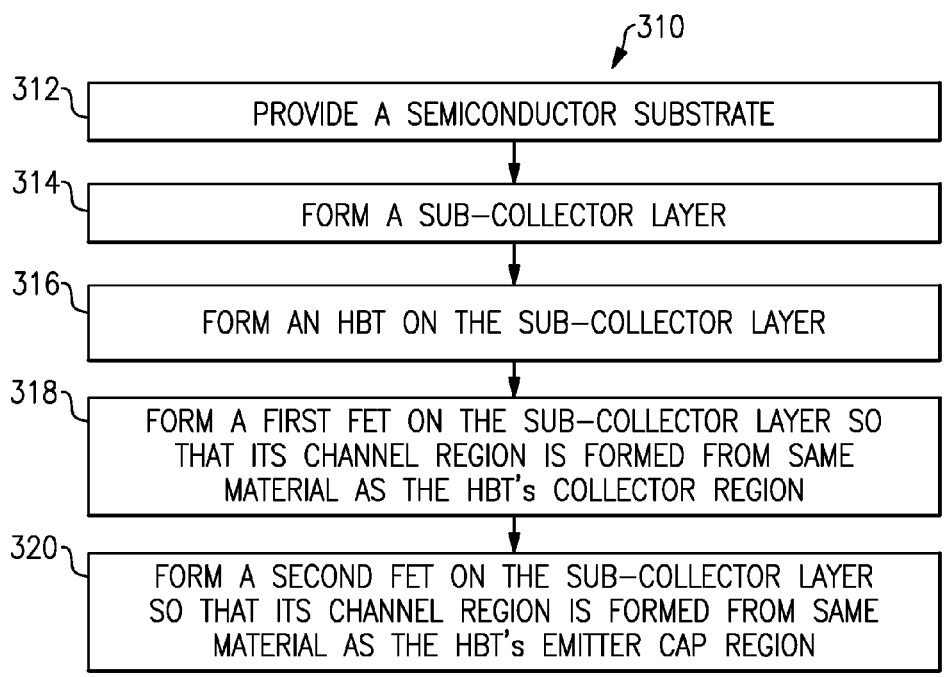
FIG. 4 shows a process that can be implemented to fabricate the example structure of FIG. 2.

FIG. 4 shows a process 310 that can be implemented to fabricate the example BiCFET 202 of FIG. 2. In block 312, a semiconductor substrate can be provided. In some embodiments, such a semiconductor layer can include one or more layers disclosed herein, including a semi-insulating GaAs layer such as the example layer 208 of FIG. 2. In block 314, a sub-collector layer can be formed over the substrate layer. In some embodiments, such a sub-collector layer can include one or more layers disclosed herein, including the n+ GaAs layer (216 and/or 251 in FIG. 2). In block 316, an HBT can be formed over the sub-collector layer. In some embodiments, such an HBT can be formed so as to include the example layers described herein in reference to FIG. 2, including a collector 219 (e.g., p– GaAs), a base 222 (e.g., p+ GaAs), an emitter 224 (e.g., n– InGaP), and an emitter cap 226 (e.g., n– GaAs). In block 318, a first FET can be formed over the sub-collector layer, so that its channel region is formed from same material as the HBT's collector region. In some embodiments, such a first FET can be formed so as to include the example layers described herein in reference to FIG. 2, including a channel layer 254 (e.g., p– GaAs), a source contact layer 258 (e.g., p+ GaAs), and a drain contact layer 262 (e.g., p+ GaAs). In block 320, a second FET can be formed over the sub-collector layer, so that its channel region is formed from same material as the HBT's emitter cap region. In some embodiments, such a second FET can be formed so as to include the example layers described herein in reference to FIG. 2, including a channel layer 263 (e.g., n– GaAs), a source contact layer 269 (e.g., n+ GaAs), and a drain contact layer 271 (e.g., n+ GaAs).

FIGS. 5-7 show processes that can be more specific examples of the processes described in reference to FIGS. 3 and 4, in the context of the example configurations of FIGS. 1 and 2. FIG. 5 shows a process 330 that can be implemented to fabricate an HBT such as those of FIGS. 1 and 2. FIG. 6 shows a process 350 that can be implemented to fabricate an FET such as those of FIGS. 1 and 2. FIG. 7 shows a process 360 that can be implemented to fabricate a second FET such as that of FIG. 2. For the purpose of description of FIGS. 5-7, it will be assumed that a semiconductor substrate (such as semi-insulating GaAs) and a sub-collector layer (such as n+ GaAs) are provided.

The example processes 330, 350 and 360 can be performed in sequence, in parallel where applicable, or in any combination thereof. Examples of such schemes of integrating an HBT with one or more FETs are described herein in greater detail.

In the example process 330 of FIG. 5 where an HBT is being fabricated, a first collector layer (e.g., n− GaAs) can be formed on the sub-collector layer in block 332. In block 334, a second collector layer (e.g., p− GaAs) can be formed on the first collector layer. In block 336, a first etch stop layer (e.g., n− or p− InGaP) can be formed on the second collector layer. In block 338, a base layer (e.g., p+ GaAs) can be formed on the first etch stop layer. In block 340, an emitter layer (e.g., n− InGaP) can be formed on the base layer. In block 342, an emitter cap layer (e.g., n− GaAs) can be formed on the emitter layer. In block 344, a second etch stop layer (e.g., n− or p− InGaP) can be formed on the emitter cap layer. In block 346, a bottom contact layer (e.g., n+ GaAs) for the emitter can be formed on the second etch stop layer. In block 348, a top contact layer (e.g., InGaAs) for the emitter can be formed on the bottom contact layer. In block 349, contacts for the emitter, base and collector can be formed so as to yield HBT configurations such as those (104, 204) of FIGS. 1 and 2.

In the example process 350 of FIG. 6 where a first FET (e.g., a pFET) is being fabricated, a doped layer (e.g., n− GaAs) can be formed on the sub-collector layer in block 352. In block 354, a channel layer (e.g., p− GaAs) can be formed on the doped layer. In block 356, a first etch stop layer (e.g., n− or p− InGaP) can be formed on the channel layer. In block 358, source and drain contact layers (e.g., p+ GaAs) can be formed on the first etch stop layer. In block 359, contacts for the source, drain, gate and back gate can be formed so as to yield FET configurations such as the example pFETs 106 and 206 of FIGS. 1 and 2.

In the example process 360 of FIG. 7 where s second FET (e.g., an nFET) is being fabricated, a first doped layer (e.g., n− GaAs) can be formed on the sub-collector layer in block 362. In block 364, a second doped layer (e.g., p− GaAs) can be formed on the first doped layer. In block 366, a first etch stop layer (e.g., n− or p− InGaP) can be formed on the second doped layer. In block 368, a third doped layer (e.g., p+ GaAs) can be formed on the first etch stop layer. In block 370, a fourth doped layer (e.g., n− InGaP) can be formed on the third doped layer. In block 372, a channel layer (e.g., n− GaAs) can be formed on the fourth doped layer. In block 374, a second etch stop layer (e.g., n− or p− InGaP) can be formed on the channel layer. In block 376, source and drain regions (e.g., n+ GaAs) can be formed on the second etch stop layer. In block 378, source and drain contact layer (e.g., InGaAs) can be formed on the source and drain regions. In block 379, contacts for the source, drain, gate and back gate can be formed so as to yield an FET configuration such as the example nFET (207) of FIG. 2.

In some implementations, the foregoing integration of an HBT with one or more FETs can be achieved in a number of ways, including a re-growth methodology, a two-step methodology, and/or a co-integration methodology. In the re-growth methodology, re-growth can involve a selective area, multilayer, and/or pre-patterned multilayer techniques.

The selected area technique can include growing one device, etching in one or more selected areas, and then growing the other device in those selected area(s). The multilayer technique can include a single growth run, with the device layers stacked, not merged or shared. The pre-patterned multi-layer technique can include selective etching of a substrate prior to depositing layers for two or more devices.

In the two-step growth methodology, one device can be formed first, followed by formation of the other device adjacent to the first device. In the context of integration of three devices (such as the example of FIG. 2), such a two-step growth can be extended to include a third step growth of the third device.

In the co-integration methodology, a single growth can yield layers that are shared by two or more devices. In some implementations, the co-integration methodology can include single growth generated layers that constitute a majority of the layers of the two or more devices.

Figure 8:
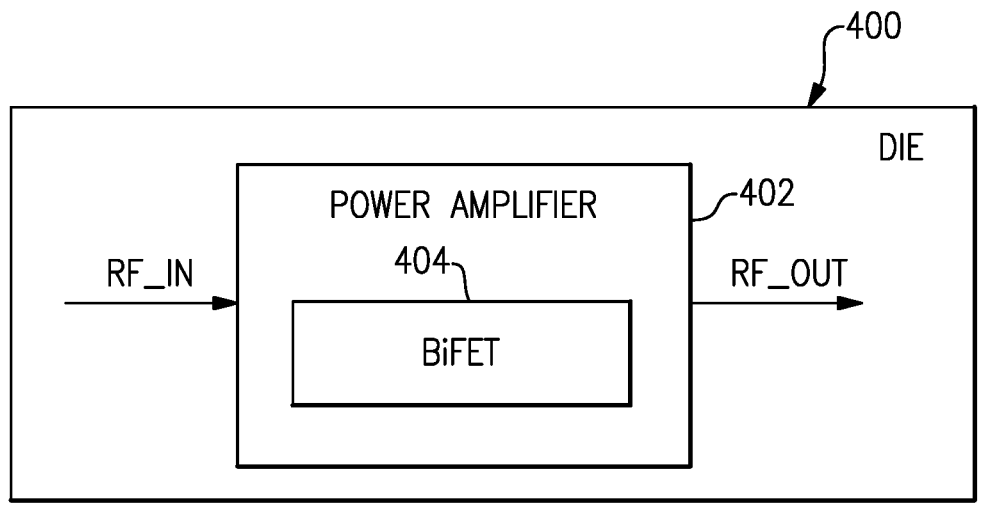
FIG. 8 shows that in some embodiments, a semiconductor die having a circuit, such as a power amplifier (PA) circuit, can include a BiFET device having one or more features as described herein.

FIG. 8 shows that in some embodiments, one or more features associated with the BiFET and/or BiCFET configurations described herein can be implemented as part of a semiconductor die 400. For example, such a die can include a power amplifier (PA) circuit 402 having one or more BiFET and/or BiCFET devices 404. Such a PA circuit 402 can be configured so as to amplify an input RF signal (RF_IN) to generate as an amplified output RF signal (RF_OUT).

Figure 9:
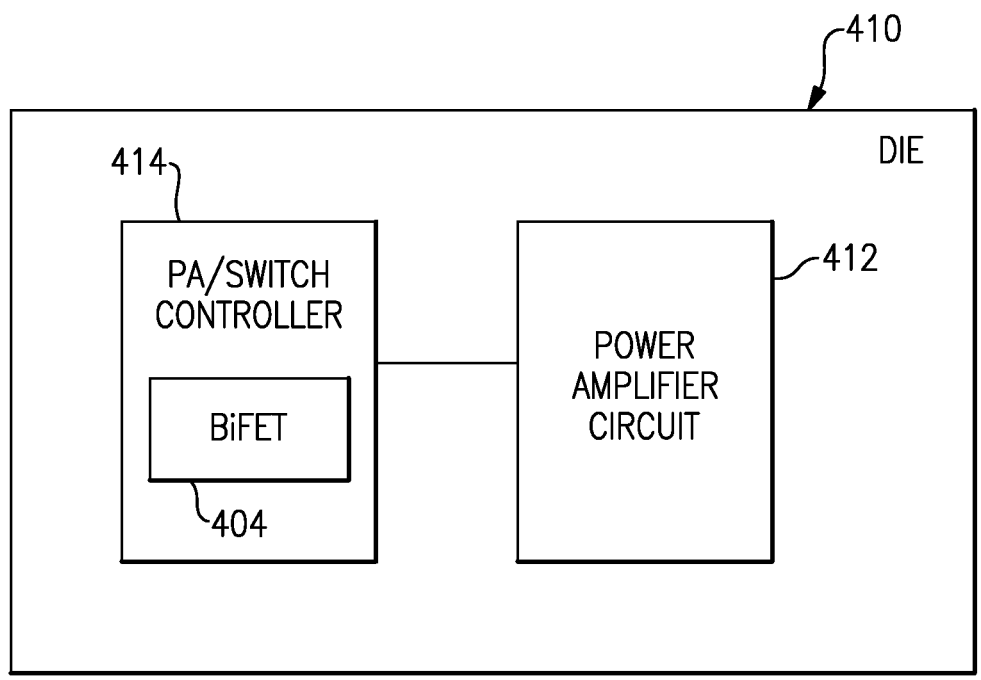
FIG. 9 shows that in some embodiments, a semiconductor die having a PA controller and/or a switch controller circuit can include a BiFET device having one or more features as described herein.

FIG. 9 shows another example die 410 that includes a PA circuit 412 controlled by a PA/Switch controller 414. The controller 414 can be configured to include one or more BiFET and/or BiCFET devices 404.

Figure 10:
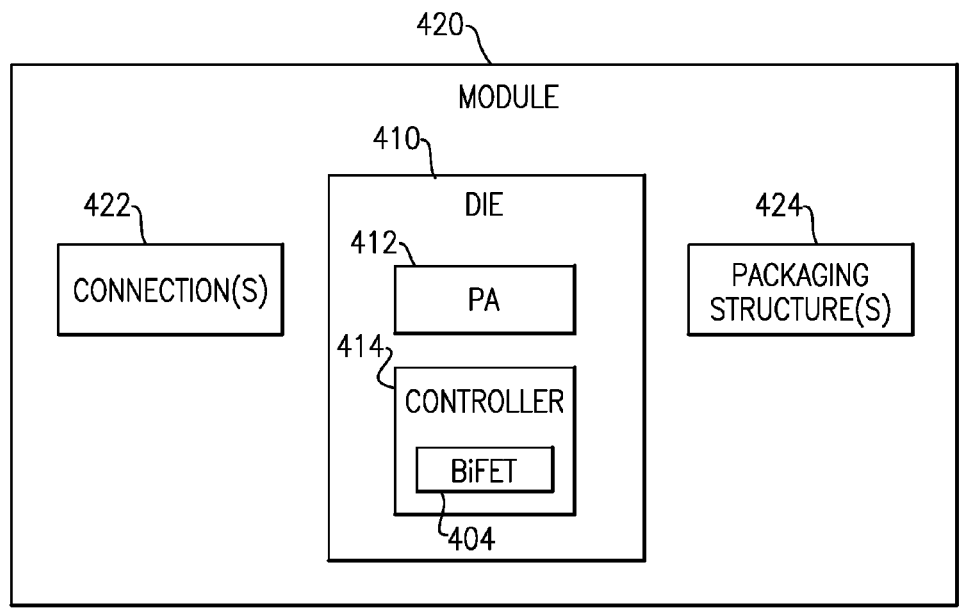
FIG. 10 shows that in some embodiments, a packaged module can include a die having one or more features as described herein.

FIG. 10 shows that in some embodiments, a die (such as the example die 410 of FIG. 9) can be implemented in a packaged module 420. The die 410 can include a PA 412 and a controller 414 having a BiFET (and/or BiCFET) 404 having one or more features as described herein. Such a module can further include one or more connections 422 configured to facilitate passage of signals and/or power to and from the die 410. Such a module can further include one or more packaging structures 424 that provide functionalities such as protection (e.g., physical, electromagnetic shielding, etc.) for the die 410.

Figure 11:
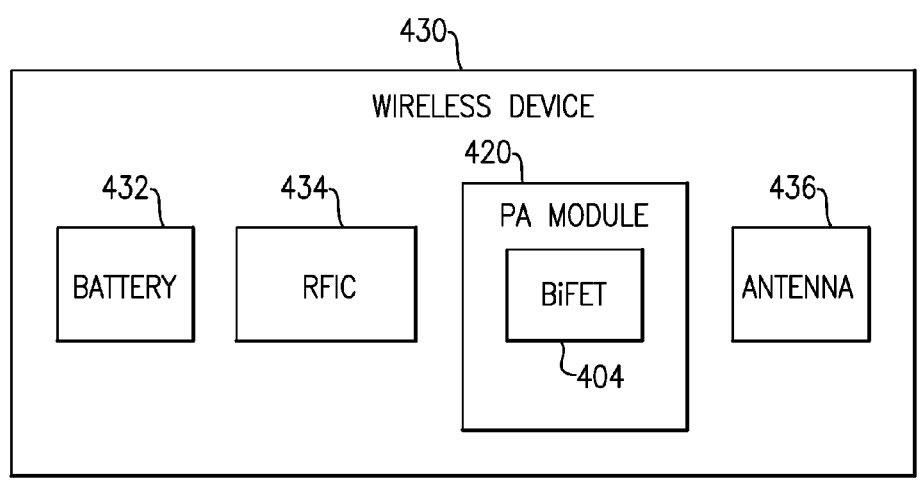
FIG. 11 shows that in some embodiments, a wireless device can include a module, such as the packaged module FIG. 10, having one or more features as described herein.

FIG. 11 shows that in some embodiments, a component such as the die 410 of FIG. 9 or the module 420 of FIG. 10 can be included in a wireless device 430 such as a cellular phone, a smart phone, etc. In FIG. 11, a packaged RF module 420 is depicted as being part of the wireless device 430; and such a module is shown to include a BiFET and/or BiCFET 404 having one or more features as described herein. In some embodiments, an unpackaged die having similar functionality can also be utilized to achieve similar functionalities. The wireless device 430 is depicted as including other common components such an RFIC 434 and an antenna 436. The wireless device 436 can also be configured to receive a power source such as a battery 432.

While various embodiments of the invention have been described, it will be apparent to those of ordinary skill in the art that many more embodiments and implementations are possible that are within the scope of the invention. For example, the invention is not limited to the gallium arsenide material system.

What is claimed is:

1. A method of forming a semiconductor apparatus, the method comprising:

forming a heterojunction bipolar transistor over a substrate, the heterojunction bipolar transistor including a first collector layer formed in a first semiconductor material and a second collector layer formed in a second semiconductor material; and forming a field effect transistor over the substrate, the field effect transistor including a channel, the channel corresponding to a first semiconductor portion of the field effect transistor formed in the first semiconductor material, and a second semiconductor portion of the field effect transistor formed in the second semiconductor material.

2. The method of claim 1 wherein the first semiconductor material includes p-type gallium arsenide.

3. The method of claim 1 wherein the second semiconductor material includes n-type gallium arsenide.

4. The method of claim 1 further comprising forming an etch stop layer segment over the first collector layer of the heterojunction bipolar transistor and the channel of the field effect transistor.

5. The method of claim 4 wherein the etch stop layer segment includes a material with etch selectivity to the channel of the field effect transistor.

6. The method of claim 4 wherein the etch stop layer segment includes indium gallium arsenide or indium gallium phosphide.

7. The method of claim 4 wherein the etch stop layer has a thickness between 10 nanometers (nm) and 15 nm.

8. The method of claim 1 further comprising forming a second field effect transistor over the substrate.

9. The method of claim 8 wherein the second field effect transistor includes a channel formed in an n-type semiconductor material.

10. The method of claim 9 wherein the n-type semiconductor material includes n-type gallium arsenide.

11. The method of claim 1 further comprising forming an emitter stack over the substrate.

12. The method of claim 11 wherein the emitter stack includes an n-type semiconductor material.

13. The method of claim 12 wherein the n-type semiconductor material of the emitter stack and second field effect transistor includes n-type gallium arsenide.

14. The method of claim 8 further comprising forming a second etch stop layer segment that is part of the emitter stack of the heterojunction bipolar transistor and is located over the channel of the second field effect transistor.

15. The method of claim 14 wherein the second etch stop layer segment includes indium gallium arsenide or indium gallium phosphide.

16. A method of forming a packaged module for a radiofrequency device, the method comprising:

providing a substrate;

forming an integrated circuit over the substrate, the integrated circuit configured to process radiofrequency signals;

forming a heterojunction bipolar transistor over the substrate, the heterojunction bipolar transistor including a first collector layer formed in a first semiconductor material and a second collector layer formed in a second semiconductor material;

forming a p-channel field effect transistor over the substrate, the p-channel field effect transistor including a channel, the channel corresponding to a first semiconductor portion of the p-channel field effect transistor formed in the first semiconductor material, and a second semiconductor portion of the p-channel field effect transistor formed in the second semiconductor material; and forming an n-channel field effect transistor over the substrate, the n-channel field effect transistor including a channel, the channel corresponding to a first semiconductor portion of the n-channel field effect transistor formed in the first semiconductor material, and a second semiconductor portion of the n-channel field effect transistor formed in the second semiconductor material.

17. The method of claim 16 further comprising forming a first etch stop layer segment over the first collector layer of the heterojunction bipolar transistor and the channel of the p-channel field effect transistor.

18. The method of claim 17 further comprising forming a second etch stop layer segment that is part of the emitter stack of the heterojunction bipolar transistor.

19. The method of claim 17 wherein the first and second etch stop layer segment includes a material with etch selectivity to the channels of the p-channel field effect transistor and n-channel field effect transistor.

20. The method of claim 17 wherein the first and second etch stop layer segments include gallium arsenide or indium gallium phosphide.

* * * * *